US006775646B1

(12) United States Patent
Tufillaro et al.

(10) Patent No.: US 6,775,646 B1
(45) Date of Patent: Aug. 10, 2004

(54) EXCITATION SIGNAL AND RADIAL BASIS FUNCTION METHODS FOR USE IN EXTRACTION OF NONLINEAR BLACK-BOX BEHAVIORAL MODELS

(75) Inventors: Nicholas B. Tufillaro, San Francisco, CA (US); David M. Walker, Cottesloe, WA (US)

(73) Assignee: Agilent Technologies, Inc., Palo Alto, CA (US)

(*) Notice: Subject to any disclaimer, the term of this patent is extended or adjusted under 35 U.S.C. 154(b) by 0 days.

(21) Appl. No.: 09/511,930

(22) Filed: Feb. 23, 2000

(51) Int. Cl.[7] .............................. G06F 17/10; G06F 7/60
(52) U.S. Cl. ......................................................... 703/2
(58) Field of Search ............................................. 703/2

(56) References Cited

U.S. PATENT DOCUMENTS

| | | | |
|---|---|---|---|
| 4,635,207 A | | 1/1987 | Payne |
| 5,675,581 A | * | 10/1997 | Soliman ..................... 370/252 |
| 5,706,402 A | * | 1/1998 | Bell ............................. 706/22 |
| 5,847,952 A | * | 12/1998 | Samad ......................... 700/48 |
| 5,872,540 A | * | 2/1999 | Casabona et al. ........... 342/362 |
| 6,029,090 A | | 2/2000 | Herbst |

OTHER PUBLICATIONS

Seng–Woon Chen; Panton, W.; Gilmore, R, "Effects of nonlinear distortion on CDMA communication systems" IEEE MTT–S International Microwave Symposium Digest, vol.: 2, Jun. 17–21 1996, Page(s): 775–778.*

Raphaeli, D., "Nonlinear multiuser detector for synchronous coded CDMA on severely distorted frequency selective channels,"Global Telecommunications Conf. Communications: The Key to Global Prosperity, GLOBECOM '96., vol.: 3, 18–22 Nov. '96 PP.: 1578.*

Tanner et al., "RBF Based Receivers for DS–CDMA with Reduced Complexity," IEEE ISSSTA, South Africa, 1998, p. 647–651.*

(List continued on next page.)

Primary Examiner—Hugh Jones

(57) ABSTRACT

A method utilizes time-domain measurements of a nonlinear device to produce or extract a behavioral model from embeddings of these measurements. The resulting behavioral model of the nonlinear device is a black-box model that accommodates nonlinear devices with one or more input ports and one or more output ports. The black-box model is a functional form that is a closed form function of input variables that produces an output as opposed to a structural form. The method of producing a behavioral model comprises the steps of applying an input signal to the nonlinear device, sampling the input signal to produce input data, measuring a response of the device to produce output data, creating an embedded data set, fitting a function to the embedded data set, and verifying the fitted function. The method may apply a CDMA type input signal in the step of applying, and/or may fit a novel radial basis function in the step of fitting a function. The input signal is constructed from a single CDMA signal representation. The method of constructing is not dependent on knowledge of the behavioral model of the nonlinear device. The novel radial basis function may be determined using a modified gaussian function.

20 Claims, 4 Drawing Sheets

U.S. PATENT DOCUMENTS

Do et al, "Efficient Filter Design for IS–95 CDMA system," IEEE Trans of Consumer Electronics, vol. 42, No. 4, p. 1011–1020, Nov. 1996.*

Stark et al., Probability and Randon Processes and Estimation Theory for Engineers 2nd Edition, 1994, p. 161, 227–233.*

David M. Walker, "Reconstruction and Noise Reduction of Nonlinear Dynamics Using Nonlinear Filters", Doctor of Philosophy Thesis, The University of Western Australia, Department of Mathematics, submitted May 1998.

David M. Walker et al., "Exploiting the periodic structure of chaotic systems for noise reduction of nonlinear signals", Physics Letters A, 242 (1998) 63–73.

David M. Walker, "Local filtering of noisy nonlinear time series", Physics Letters A, 249 (1998) 209–217.

David M. Walker et al., "Noise Reduction of Chaotic Systems By Kalman Filtering and By Shadowing", International Journal of Bifurcation and Chaos, vol. 7, No. 3 (1997) 769–779.

David M. Walker et al., "Reconstructing Nonlinear Dynamics By Extented Kalman Filtering", International Journal of Bifurcation and Chaos, vol. 8, No. 3 (1998) 557–569.

David M. Walker et al., "Local modelling and Kalman filtering of noisy nonlinear time series", 1997 International Smposium on Nonlinear Theory and its Applications (NOLTA '97), vol. 2 (1997) 1141–1144.

David M. Walker et al., A Nonlinear Observer for Synchronization of Chaotic Systems', Proceedings of 1999 ASME Design Engineering Technical Conferences (DETC'99), Sep. 12–15, 1999, Las Vegas, NV, pp 2869–2872.

Cao et al., "Determining the Minimum Embedding Dimensions of Input–Output Time Series Data", International Journal of Bifurcation and Chaos, vol. 8, No. 7, (1998) 1491–1504.

David M. Walker, et al; Constructing Transportable Behavioural Models For Nonlinear Electronic Devices: Physics Letters A, May 17, 1999, Elsevier, Netherlands; vol. 255, No. 4–6, pp. 236–242, XP–001100673; ISSN: 0375–9601.

* cited by examiner

US 6,775,646 B1

EXCITATION SIGNAL AND RADIAL BASIS FUNCTION METHODS FOR USE IN EXTRACTION OF NONLINEAR BLACK-BOX BEHAVIORAL MODELS

CROSS-REFERENCE TO RELATED APPLICATIONS

This patent application hereby references a related, co-pending patent application Ser. No. 09/420,607, filed Oct. 18, 1999, which is incorporated herein by reference.

BACKGROUND OF THE INVENTION

1. Field of the Invention

The present invention relates to the determination of behavioral models for nonlinear devices, circuits, subsystems or systems. In particular the present invention is a method for creating excitation signals and a method for performing function fitting in the determination of behavioral models for nonlinear devices, circuits, subsystems, and systems from embeddings of time-domain measurements.

2. Description of the Related Art

Linear, time invariant (LTI) devices, circuits, subsystems, and systems are completely characterized by their transfer functions. To understand the performance of an LTI device, one need only determine the transfer function of the LTI device. Once the transfer function is known, the operation of the device in a system is known completely for all input conditions. The same is true for LTI circuits, subsystems and systems.

A transfer function is a complex frequency domain-function that describes the output of an LTI device in terms of its inputs and therefore, forms a complete description of the LTI device. The term complex function when used herein refers to a function that includes complex numbers having a real and an imaginary part. An equivalent form of the transfer function of an LTI device in the time-domain is called an impulse response of the LTI device. A one-to-one relationship exists between the transfer function in the frequency-domain and impulse response in the time-domain. In addition, the transfer function and the impulse response are not functions of and do not depend on the input signal that is applied to the LTI device.

The determination of the transfer function, especially if it involves measured data from the LTI device, is known as model development or model parameter extraction. Once a model of an LTI device is developed, or equivalently the transfer function is known, for a given device, the actual device may be replaced by a virtual device based on the model in any simulation of a system using the device. Often the development of the model involves extraction or determination of model parameters from a set of test data that represents the device of interest.

Transfer functions of LTI devices, circuits, subsystems, or systems can be extracted from measurements made with a vector spectrum or vector network analyzer. A swept or stepped frequency input signal is generated and the vector spectrum analyzer or network analyzer records the output of the LTI device. Then, a transfer function can be computed by comparing the input and output signals. Furthermore, models suitable for simulation of a given LTI device or circuit can extracted from transfer functions using, among other things, linear system identification techniques.

Time-domain measurements provide an alternate method of characterizing LTI devices or circuits. Pulse inputs that approximate an impulse are applied to a device and the outputs are measured and recorded. In one such well known, time-domain method, the poles and zeros of the Laplace transform of the governing differential equation of the device are estimated from the recorded output data. Once a suitable governing differential equation is determined, the device transfer function is calculated. In an alternative method, the measured data associated with the impulse response is transformed using a Fast Fourier Transform (FFT) to the frequency-domain where a linear system identification method is then used to extract the transfer function.

The characterization or modeling of nonlinear devices or circuits is much more difficult than that for LTI devices. Reference to a "nonlinear device" when used herein will be understood to include devices, circuits, subsystems or systems with a nonlinear input-output relationship. Unlike the linear case, the nonlinear device or circuit is not readily represented by a transfer function or impulse response, at least not one that is independent of the input signal or stimulus. However, there is still a need to model nonlinear devices so that their performance in systems can be evaluated efficiently. This is especially true when it is impractical or too expensive to use the actual device, such as when the device is still being designed.

It is desirable to have a method for characterizing and developing a model of nonlinear devices to avoid the need to have the actual device available whenever its performance in a system must be investigated. Furthermore it is advantageous to have such a modeling method utilize a finite set of measurements, either actual measurements or measurements of a simulation of the device. The model so generated must accurately predict the performance of the device over all expected operational conditions within a given level of accuracy and with an acceptable amount of computational cost.

The term "behavioral model" herein refers to a set of parameters that define the input-output behavior of a device or circuit. Generally, a behavioral model must be of a form suitable for rapid simulation. "Simulated measurements" refers to values of voltage, current or other physical variables obtained from device, circuit or system simulation software. The objective of building a behavioral model from actual or simulated measurements is to reduce simulation time by replacing a complex circuit description in the simulation with a simpler, easier to simulate, behavioral model.

In many cases, nonlinear devices are electronic in nature (e.g. transistors, diodes). In these cases the measurements used to produce a model of the device are typically measured voltages and currents in and out of the ports of the device or equivalently incident or reflected power waves present at the ports at various frequencies. The models extracted from the measurements generally need to reflect the dynamic relationships between the voltages and currents at the ports. The model can be used, for example, to compute the currents into the ports from recent values of the voltages across the ports. Often this is the essential computation that must be provided to electronic circuit simulators by a software module that represents a device.

Mechanical and hydraulic devices can also exhibit nonlinear behavior and, therefore, be modeled as nonlinear devices for which construction of a suitable behavioral model would be beneficial. For example, a vehicular system comprising driver inputs and vehicle response may be represented in terms of a nonlinear behavioral model. In the case of vehicular systems, the input measurements might be of variables such as steering wheel position, brake pressure, throttle position, gear selection and the response measurements might be of variables such as the vehicle speed, lateral and longitudinal acceleration, and yaw rate. The behavioral model extracted from the measurements needs to reflect the dynamic relationship between the driver inputs that are applied and the subsequent response of the vehicle. In other words, the model defines a "virtual car" that can be "driven" using previously recorded or real-time measured driver inputs.

A variety of methods have been developed to characterize and develop models of nonlinear devices. However, these methods generally have severe limitations associated with them. For instance, many of the techniques are limited to use with so called "weakly nonlinear devices", those devices whose performance is nearly linear. Therefore, these techniques are not suitable for many nonlinear devices.

One such approach to characterization of weakly nonlinear devices is to simply assume that the device is linear, at least in the operational range of interest. Under this assumption, a variant of the time-domain impulse response method described hereinabove can be used. For devices that are, in fact, weakly nonlinear devices, this approach yields reasonably good results. However, the accuracy of such a model will degrade rapidly as the amount or degree of nonlinearity in the device increases.

Another class of methods for characterizing nonlinear devices is represented by the Volterra input-output maps method (VIOMAPs) also known as the Volterra Series Method. VIOMAPs are models of nonlinear devices or circuits that can be extracted from frequency domain measurements such as those produced by using a vector spectrum analyzer. Here again, the usefulness of such models is limited by the assumption of weak nonlinearity. In addition, VIOMAPs and related methods can only model the steady state behavioral or response of the device. A steady-state response is the response of a device, linear or nonlinear, to a repeating input signal. An example of a steady-state response is the response to a sine wave input after sufficient time has passed to allow the transients associated with the application of the sine wave to decay. VIOMAPs and the related methods are powerful methods that have found many useful applications. However, VIOMAPs, as noted above, cannot handle strong nonlinearities or transient inputs. VIOMAPs are restricted to modeling the steady state behavior of devices that exhibit weak nonlinearities.

Another, somewhat different, method of characterizing nonlinear devices is to use an equivalent circuit representation of the device of interest. The approach in this method is to assume an equivalent circuit topology with a certain circuit parameter left free or unspecified that is expected to adequately represent the device or circuit. For example, equivalent circuits are known that adequately represent certain classes of transistors (e.g. MOSFETs or BJTs). Given the assumed equivalent circuit, a set of measurements is performed on the device from which the correct values of the free parameters can be computed or deduced for a particular device.

As with the other methods, this approach for nonlinear device characterization has a number of serious disadvantages. Chief among the disadvantages is the need for a priori knowledge of an equivalent circuit that adequately represents the device of interest. This often means that significant knowledge of the device is required before modeling can begin. If incorrect assumptions are made regarding the structure of the equivalent circuit, the method may not yield satisfactory results. Put another way, the approximation that is being made by choosing a particular equivalent circuit over another has an impact on accuracy that is hard to determine. In addition, this method is only useful when the device being modeled is of a type similar to electronic circuitry (e.g. a hydraulic device or spring-mass-dashpot system) that a representative equivalent circuit can be created. Finally, the equivalent circuit can require a significant amount of computer time to simulate, thereby often making this method unacceptably costly for use in the simulation of large systems.

Therefore, it would be desirable to have a method for the construction of a behavioral model of a nonlinear device that is not limited to assuming the device is weakly nonlinear and that does not require excessively large amounts of computational effort to produce simulated results. In addition, it would be desirable if this method were not limited to steady-state response characterizations and this it method did not require any a priori knowledge of the device being modeled. Moreover, it would be advantageous if this method would allow the model to be constructed from either actual measurements or simulated measurements of the device. Finally, it would be advantageous if this method utilized an excitation signal and employed a functional fitting technique that were broadly applicable to many nonlinear devices. Such a nonlinear characterization and model construction method would overcome a long-standing problem in the area of nonlinear device modeling technology.

SUMMARY OF THE INVENTION

The present invention is based on the method for producing behavioral models of nonlinear devices that is described in co-pending application Ser. No. 09/420,607, filed Oct. 18, 1999. In particular, the methods of the present invention are a method for producing behavioral models of nonlinear devices utilizing a robust excitation signal, a method for producing behavioral models of nonlinear devices utilizing a novel radial basis function, a method for constructing the robust excitation signal, and a method of determining a novel radial basis function. The behavioral models resulting from the methods of the present invention accommodate nonlinear devices with one or more input ports and one or more output ports.

The methods of producing a behavioral model of a nonlinear device from embeddings of time-domain measurements of the present invention comprise the steps of applying an input signal to the nonlinear device, or equivalently to a virtual device, sampling the input signal to produce input data, measuring a response to the input signal at the output of the device to produce output data corresponding to the input data, creating an embedded data set using a first subset of the input data and a first subset of the output data, fitting a function to the embedded data set, and verifying the fitted function using a second subset of the input data and a second subset of the output data, wherein the verified fitted function is the behavioral model of the nonlinear device. In another embodiment, the fitted function can be used to compute a continuous-time model from the discrete behavioral model developed in the aforementioned steps.

In one embodiment, the method producing a behavioral model of the present invention utilizes a code division multiple access signal (CDMA) as the input signal in the step of applying. In another embodiment, the method of producing a behavioral model of the present invention utilizes a novel radial basis function in the step of fitting a function to the embedded data set. In yet another embodiment, the method of producing a behavioral model utilizes both the CDMA type signal as an input signal in the step of applying and the novel radial basis function in the step of fitting.

Unlike the aforementioned conventional methods, the methods of the present invention are not restricted to modeling weakly nonlinear devices but can handle hard or strong nonlinearities. The methods accommodate steady-state as well as dynamic nonlinearities, requires no a priori assumptions regarding the device model structure and can handle devices with multiple, dependent inputs. Further, the methods operate in the discrete time-domain with sampled measurements of input and output variables but are readily extended to a continuous representation of the device behavioral model. As such, the behavioral models produced by these methods are general in nature and are readily implementable representations of nonlinear devices including those exhibiting strong nonlinearities.

Moreover, the behavioral model created from the methods of the present invention can be used to simulate the output of the device, given input signals in the frequency-domain. The excitation signals utilized can be generated at reasonable cost at any frequency up to and beyond microwave frequencies.

In another aspect of the present invention, a method of constructing an input or excitation signal for use in producing a behavioral model is also provided. The method of construction of the invention constructs a CDMA type excitation signal. The excitation signal so constructed is applied to a nonlinear device for behavioral model extraction from embedded time-series measurements according to the invention.

The CDMA type signal is a single signal as opposed to multiple signals typical of the excitation signal constructed according to the co-pending method. Advantageously, the single CDMA type signal of the present invention provides excellent phase space coverage. Therefore, use of the CDMA type signal in the methods of the present invention yields models with excellent agreement between the behavioral model produced thereby and the actual nonlinear device.

In yet another aspect of the present invention, a method of determining a radial basis function for use in determining a behavioral model is provided. The radial basis function comprises a novel modified gaussian function. When used in the production of a behavioral model in the methods of the present invention, the novel radial basis function of the present invention provides excellent agreement between the behavioral model and the nonlinear device being modeled. In addition, the radial basis function is stable owing to the inherent partitioning of the modified gaussian function into two parts, one part associated with output data from the model and the other part associated with input data from the excitation signal.

In yet another aspect of the present invention, the CDMA type excitation signal and the radial basis function of the present invention can be used together in the method of producing a behavioral model of the present invention.

BRIEF DESCRIPTION OF THE DRAWINGS

The various features and advantages of the present invention may be more readily understood with reference to the following detailed description taken in conjunction with the accompanying drawings, where like reference numerals designate like structural elements, and in which.

DETAILED DESCRIPTION OF THE PREFERRED EMBODIMENTS

The methods of the present invention utilize time-domain measurements of a nonlinear device to produce or extract a black box behavioral model of the device from embeddings of these measurements. The methods of the present invention are applicable to modeling devices where information about the device is provided by either actual measurements or simulated measurements.

The use of embeddings to extract models from time domain measurements of nonlinear devices is called nonlinear time series analysis (NLTSA). The term "black box" as used herein refers to a model that requires little or no detailed information, such as the topology of an equivalent circuit, or knowledge of the underlying physics, of the device be known before the model is constructed. The term "embedding" as used herein refers to a function or mapping from a set U to a new set W, where U→W|U∈$\Re^m$; W∈ $\Re^n$ and n≧m.

The methods of the present invention are based on the method described in co-pending application Ser. No. 09/420,607, filed Oct. 18, 1999. In one embodiment, the method of the present invention differs from the method of the co-pending application in that an input signal of the present invention is a specific type of CDMA signal having advantages in some instances to the input signals of the co-pending application. In another embodiment, the method of the present invention differs from the method of the co-pending application in that the method of the present invention incorporates a novel, radial basis function.

Figure 1:
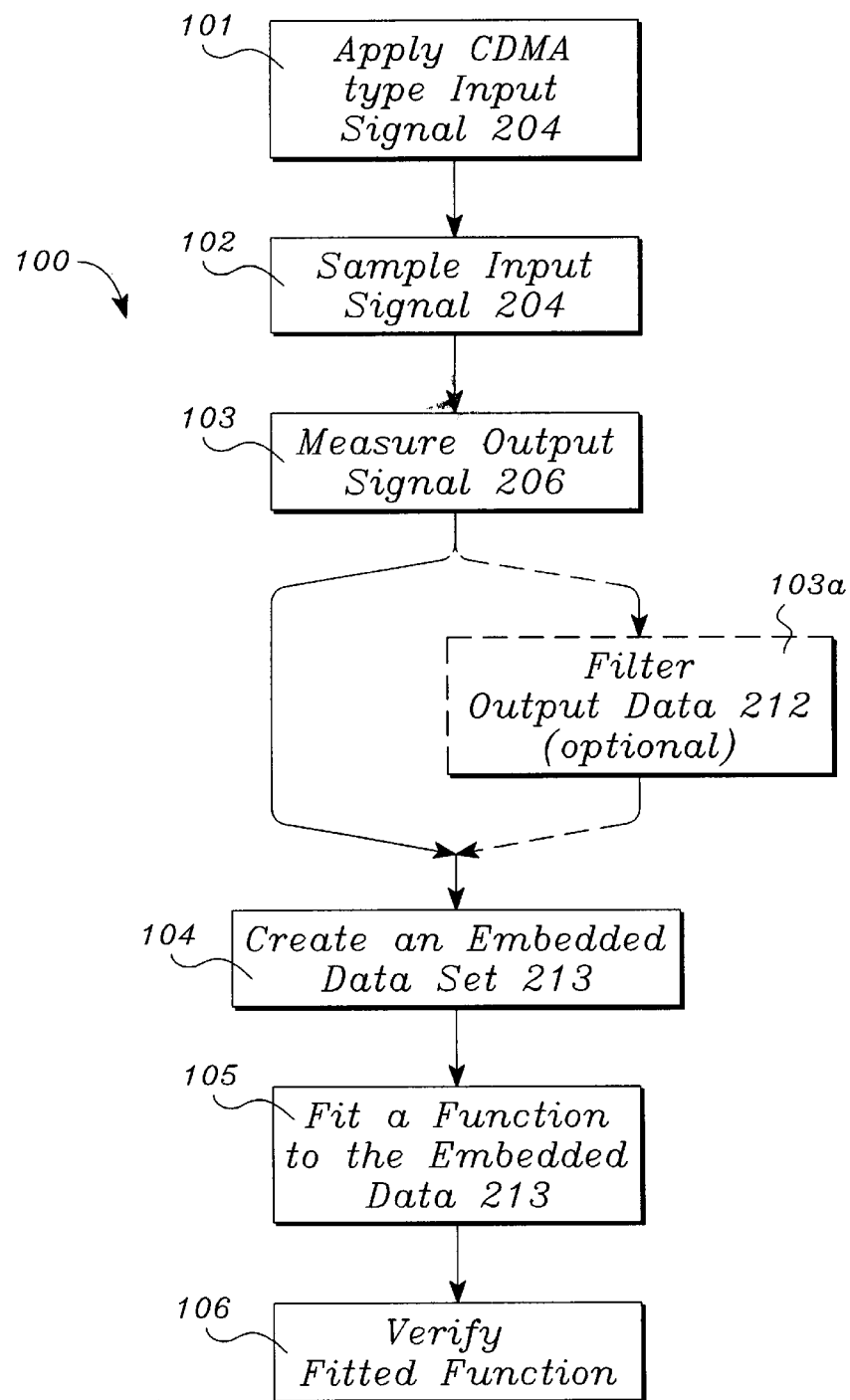
FIG. 1 illustrates a block diagram of the method of producing a behavioral model of the present invention utilizing a CDMA type excitation signal.

A block diagram of one embodiment of the methods of the present invention is illustrated in FIG. 1. In accordance with the invention, the method 100 of producing a behavioral model of a nonlinear device from embeddings of time-domain measurements is an iterative process and comprises the step of applying 101 an input signal 204 to the nonlinear device. The input signal 204, u(t), of the method 100 of the present invention, also referred to herein as an excitation signal 204, is a code division multiple access (CDMA) type signal given by $$u(t) = A \cos(2\pi f_c t) \sum_{i=1}^{N} b_i(t) p_i \qquad (1)$$

wherein the coefficient A is a constant amplitude value used to scale u(t), the input signal 204, $f_c$ is a carrier frequency of the CDMA type input signal 204, $b_i(t)$, where i=1→N, are N-dimensional random vectors sequenced on t. Preferably, $b_i(t)$ is a binary random vector or sequence, sequentially taking on values of −1 or +1 as t is indexed. The variable 't' as used herein refers to an independent variable generally associated with time. The coefficients $p_i$ are the coefficients of a finite impulse response (FIR) filter. The preferred embodiment of the FIR filter provides an input signal 204 with a flat spectrum and with a fixed bandwidth about a given center frequency.

As in the method of the co-pending application, the input signal 204 of the method 100 of the present invention is constructed such that it covers a large portion of the "phase space" of the non-linear device to insure that the device is adequately excited for accurate model production. The term "phase space" as used herein refers to the collection of possible states of a dynamical system. A phase space can be finite, countably infinite, or uncountably infinite in dimension. For example, the phase space of an ideal coin toss experiment has a dimension of two (i.e. "heads" or "tails"). In the co-pending application, the requirement for adequate phase space coverage was met by performing a series of "experiments" involving the sequential application of a number of carefully selected single-tone signals to the nonlinear device. The selection of these single-tone signals is such that after numerous experiments, the phase space of the device was covered adequately and an accurate model was produced. However, in the present method 100, the phase space coverage is provided by a single input signal 204 in a single experiment. Additionally, in both the co-pending method and the method 100 of the present invention it is a desirable feature of the input signal 204 that it can be generated economically or, in other words, the input signal 204 should be relatively easy to produce.

The input signal 204 as given by equation (1), even though known in the art as useful for spread spectrum communications, advantageously and unexpectedly provides excellent phase space coverage for most nonlinear devices when used in the method 100. Therefore, the input signal 204 as given by equation (1) is an excellent input signal for producing a behavioral model of a nonlinear device from embeddings of time-domain measurements according to the present invention. In addition, the input signal 204 of equation (1) is relatively simple to generate and, unlike the method of the co-pending application, does not require multiple experiments to be performed. Construction of the input signal 204 given by equation (1) is described in more detail hereinbelow.

The method 100 further comprises the step of sampling 102 the input signal 204 to produce input data 210. The input signal 204 is sampled at discrete time intervals during the step of applying 101. The time intervals can be fixed or variable and generally depend on the input signal 204 characteristics. Sampling 102 may be either actual sampling of the input signal 204, as it is applied to the device, or virtual sampling, wherein the samples are created directly from a mathematical description of the input signal 204. In the preferred embodiment, the time intervals are fixed according to standard engineering practice and the input data 210 is stored as an array of values in a computer memory.

The method 100 further comprises the step of measuring 103 an output signal or a response signal 206 to the input signal 204 at an output port of the device to produce output data 212 corresponding to the input data 210. The response is measured at discrete time intervals and the output data 212 represents a time-series of the response signal. In the preferred embodiment, the response signal 206 is measured at the same discrete time intervals and times as is used for sampling 102 the input signal 204 and the output data 212 is stored as a separate array or set of values in a computer memory.

The step of measuring 103 may be followed by a step of filtering 103a the output data 212 in a preferred embodiment of the method 100. The step of filtering 103a is used to reduce the noise content of the output data 212. Noise is a corruption of the data that may be introduced during the step of measuring 103 and is well known to one skilled in the art. The step of filtering 103a may be accomplished using either linear or nonlinear filtering techniques. Preferably, the data 212 is filtered using one of several nonlinear filtering techniques known in the art and described further in the co-pending application. Nonlinear filtering techniques have the advantage of preserving the nonlinear response characteristics of the device present in the output data 212. Moreover, where the input data 210 is sampled directly from the input signal 204, the input data 210 may also be filtered using well known techniques.

The method 100 still further comprises the step of creating 104 an embedded data set 213 using a first subset 210a of the input data and a first subset 212a of the output data. The step of creating 104 an embedded data set 213 comprises the steps of determining 104a an embedding type and dimension and then embedding 104b the first subsets 210a, 212a in an embedding space defined in the step of determining 104a. Applicable embedding types of the present invention include, but are not limited to, so called "lagged" embeddings, embeddings using singular value decomposition (SVD) of the data, wavelet embeddings and combinations thereof. The embedding types differ by the specific linearly independent functions that are used, as is described further hereinbelow. However, in general terms, the embedding type can be represented by a set of functions E as given by $$E = \begin{cases} e_1(\vec{y}(t-\tau), \ldots, \vec{y}(t-l\tau), \vec{u}(t-\tau), \ldots, \vec{u}(t-m\tau)), \\ e_2(\vec{y}(t-\tau), \ldots, \vec{y}(t-l\tau), \vec{u}(t-\tau), \ldots, \vec{u}(t-m\tau)), \\ \vdots \\ e_n(\vec{y}(t-\tau), \ldots, \vec{y}(t-l\tau), \vec{u}(t-\tau), \ldots, \vec{u}(t-m\tau)) \end{cases}$$

where elements of the set, $e_n$, are functions of the input and output data sets and where l, m, and τ are dependent on the specific embedding type and related to the embedding dimension. An example of a function from an embedding E is a first order approximation of a derivative of the output variable $\vec{y}(t)$ given by $$e_1(\vec{y}(t-\tau), \ldots, \vec{y}(t-l\tau), \vec{u}(t-\tau), \ldots, \vec{u}(t-m\tau)) = \frac{y(t-2\tau) - y(t-\tau)}{\tau}$$

Another example of an applicable embedding function $e_n$ is the Haar wavelet of length 4 operating on $\vec{y}(t)$ given by $$e_2(\vec{y}(t-\tau), \ldots, \vec{y}(t-l\tau), \vec{u}(t-\tau), \ldots, \vec{u}(t-m\tau)) =$$
$$y(t-4\tau) + y(t-3\tau) - y(t-2\tau) - y(t-\tau)$$

The subscripts in these examples are arbitrary. A so-called "pure" lag embedding would be given by $$E_{lag} = \begin{cases} e_1(\vec{y}(t-\tau), \ldots, \vec{y}(t-l\tau), \vec{u}(t-\tau), \ldots, \vec{u}(t-m\tau)) = \vec{y}(t-\tau), \\ e_2(\vec{y}(t-\tau), \ldots, \vec{y}(t-l\tau), \vec{u}(t-\tau), \ldots, \vec{u}(t-m\tau)) = \vec{y}(t-2\tau), \\ \vdots \\ e_n(\vec{y}(t-\tau), \ldots, \vec{y}(t-l\tau), \vec{u}(t-\tau), \ldots, \vec{u}(t-m\tau)) = \vec{u}(t-m\tau) \end{cases}$$

where k=l+m. Therefore, it would be evident to one skilled in the art that a set of functions of the input and output data can be chosen.

Determining 104a the embedding dimension, in part, involves choosing the number of linearly independent functions to be used. The combination of the embedding dimension and the embedding type or functions defines the embedding space. Along with determining 104a an embedding type, determining the embedding dimension is often accomplished in practice in an iterative process. In the step of embedding 104b, the first subset 210a of the input data and the first subset 212a of the output data are "embedded" in the embedding space defined and dimensioned in step 104a. The step of embedding 104b transforms the first subset 210a of the input data and the first subset 212a of the output data into a first embedded data set 213a. In general, the amount of data contained in the first embedded data set 213a is larger than that in the original first subsets 210a, 212a.

The first subset 210a of input data and the first subset 212a of output data contain less data than the total data produced for each according to a preferred embodiment of the method 100. The remaining portions of the input data 210 and the output data 212 not included in the first subsets are used in a verification step 106 described below and are referred to as a second subset 210b of input data and a second subset 212b of output data, respectively. In another embodiment thereof, the first subsets 210a', 212a' comprise all of the available data and therefore, additional data are generated for the second subsets 210b', 212b' after the step of creating 104 the embedded data set 213 for use in the verification step 106. The step of creating 104 the embedded data set 213, in particular the step of determining 104a the embedding type and the embedding dimension, is described further in the co-pending application.

The method 100 further comprises the step of fitting 105 a function G(•) from embedded data set 213 to the corresponding output data 212. In general, the function G(•) is a function of the embedded data set 213 created in the step of embedding.

$$\vec{y}(t+1) = G \begin{Bmatrix} e_1(\vec{y}(t), \vec{y}(t-\tau), \ldots, \vec{y}(t-l\tau), \vec{u}(t-\tau), \ldots, \vec{u}(t-m\tau)), \\ e_2(\vec{y}(t), \vec{y}(t-\tau), \ldots, \vec{y}(t-l\tau), \vec{u}(t-\tau), \ldots, \vec{u}(t-m\tau)), \\ \vdots \\ e_n(\vec{y}(t), \vec{y}(t-\tau), \ldots, \vec{y}(t-l\tau), \vec{u}(t-\tau), \ldots, \vec{u}(t-m\tau)) \end{Bmatrix}$$

where $\vec{y}(t)$ is the first subset 212a of the output data at time t, $\vec{u}(t)$ is the first subset 210a of the input data at time t, l is the number of lagged data samples taken from the first output data subset 212a, m is the number of lagged data samples taken from the first input data subset 210a and $\tau$ is a multiple of a time between samples $\Delta t$ ($\tau=k\Delta t$), also called a "lag". The sample interval or sample time $\Delta t$ corresponds to the above described discrete time interval used in the sampling step 102 and the measuring step 103. In the specific case of a lag embedding, the function G(•) is of the form $$\vec{y}(t+1)=G(\vec{y}(t), \vec{y}(t-\tau), \ldots, \vec{y}(t-l\tau), \vec{u}(t-\tau), \ldots, \vec{u}(t-m\tau))$$

A corresponding form of G(•) for other embedding types would be readily apparent to one skilled in the art.

The step of fitting 105 comprises the steps of determining 105a the function G(•), and selecting 105b the structural parameters ($\tau$, l and m in the lagged embedding case) and/or other parameters of function G(•). For example, other parameters may include polynomial coefficients in the case of a polynomial form of the function G(•). The step of fitting 105 is often called model estimation or training and is well known to those skilled in the art. Likewise, when other embeddings are used, one skilled in the art would readily recognize an alternative form those hereinabove that would be applicable in addition to the structural parameters involved.

There are a number of techniques for performing the step of fitting 105 that are generally applicable to a wide variety of embedding types. The techniques include, but are not limited to: (i) least-squares fitting with multivariate polynomials, (ii) fitting using other appropriate basis functions, such as radial basis functions, (iii) fitting using a neural network as a universal function approximator, (iv) fitting with local linear models, and (v) fitting with cluster-weighted models. In addition, there are many other techniques for fitting a function to data that may be used with the present invention. There may be advantages of using one of these methods over the others in specific practical situations. Such advantages and the correct choice of the function fitting method given a particular embedding should be obvious to one skilled in the art and are all within the scope of the present invention.

The method 100 further comprises the step of verifying 106 the fitted function G(•) using the second subset 210b, 212b of the input data and the output data. The step of verifying 106 comprises the step of using 106a the second subset 210b of input data to produce a second embedded data set 213b. The step of verifying 106 further comprises the step of using 106b the first embedded data set 213a and the second embedded data set 213b in the fitted function G(•) to produce a first predicted data and a second predicted data, respectively. The step of verifying 106 further comprises the step of comparing 106c the second predicted data from the function G(•) to the second subset 212b of output data. The objective of the step of comparing 106c is to determine if the predicted data is sufficiently similar to the second subset 212b of the output data from the device. Whether the predicted data and the second subset 212b of the output data are sufficiently similar will depend on the particular application and should be apparent to one skilled in the art. If the second predicted data and the second subset 212b of the output data are sufficiently similar then the fitted function G(•) accurately mimics or is said to accurately model or predict the performance of the device. The verified fitted function G(•) then becomes the behavioral model of the nonlinear device in a discrete time representation.

In general, the definition of "sufficiently similar" will depend on the specific application of the present invention. However, two tests are typically performed to help verify 106 the fit of the function G(•). The first test assesses the absolute error between the second predicted data produced by the fitted function G(•) and measured data that makes up the second subset of output data 212b. The second test assesses whether the function G(•) fits well to both the first and second embedded data sets (213a, 213b) with respect to the corresponding first and second subsets of the output data (212a, 212b). Both of these tests are described in detail in the co-pending application.

In another embodiment of the method 100, the step of verifying 106 further comprises the step of converting 106d the behavioral model from a discrete time representation to a continuous time representation. Converting from a discrete time representation to a continuous time representation is well known to those skilled in the art.

In the method 100 of the present invention, the step of applying 101 the excitation signal 204 to a device is followed by the step of sampling 102 the input signal 204 to produce input data 210 and the step of measuring 103 the response of the device to the excitation signal 204 to produce output data 212. Preferably, the steps of sampling 102 and measuring 103 are performed at discrete time intervals. It is well known by those skilled in the art that typical measurements for electronic devices include electrical values such as voltages, currents, incident and reflected power waves at various frequencies. Typical measurements for mechanical or hydraulic devices including but not limited to the motorized vehicle example, are temperature, pressure, volumes, positions, speeds, and accelerations. For example, measurements taken on the vehicle might comprise driver inputs such as steering wheel position, brake pressure, throttle position, gear selection and the response of the vehicle including speed, lateral and longitudinal acceleration, and yaw rate. In the preferred embodiment of the present invention, the input signal 204 to and the response or output signal 206 of, the device are sampled 102 and measured 103 by sampling and digitizing with an appropriate sample rate or sample interval $\Delta t$. One skilled in the art would recognize that there are many approaches to sampling an input signal 204 and measuring an output signal 206 of a device and without undue experimentation would be able to choose an appropriate system for a given device or class of devices.

Further, in accordance with the invention, the step of creating 104 a first embedded data set 213a involves operations that transform the first subset 210a of input data and the first subset 212a of output data into a new, usually expanded, first embedded data set 213a by applying selected, linearly independent functions to the first input data subset 210a and/or the first output data subset 212a. In the preferred embodiment, the linearly independent functions defined by a choice of the embedding type are either lags of the input and output data (210, 212) or combinations of lags and wavelets.

In another embodiment, the method 100' of producing a behavioral model of the present invention comprises the step of sampling 102, the step of measuring 103 the output signal 206, the step of creating 104 an embedded data set 213 a function to the embedded data 213, and the step of verifying 106 the fitted function as described above for the method 100. However, in the method 100', the step of applying 101' and input signal 204' and the step of fitting 105' a function to the embedded data 213 differ from the method 100 as described below.

Figure 2:
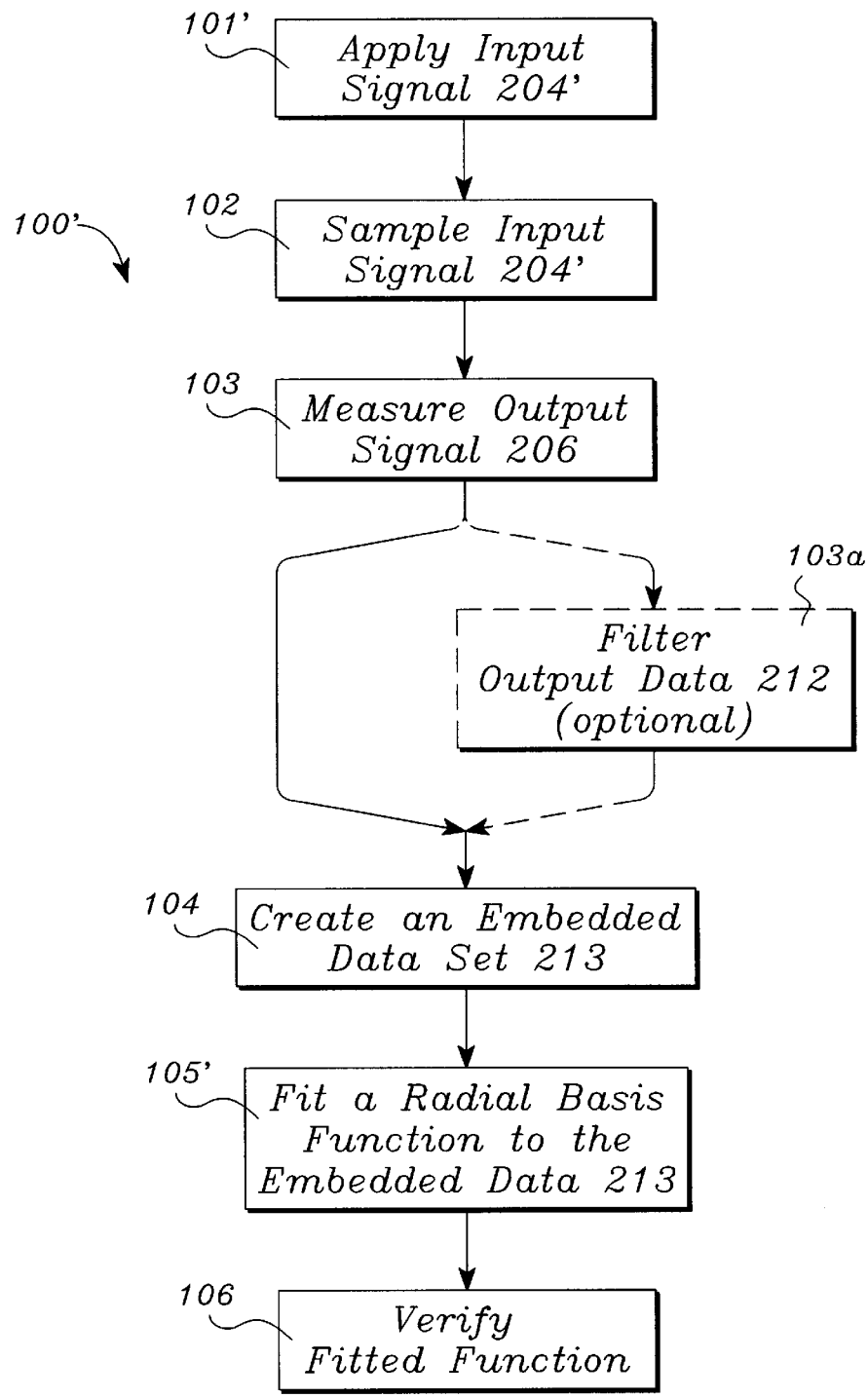
FIG. 2 illustrates a block diagram of the method of producing a behavioral model of the present invention utilizing a radial basis function.

A block diagram of the method 100' is illustrated in FIG. 2. In the method 100' the step of fitting 105' utilizes a function $G(\bullet)$ of the form $$\vec{y}(t+1) = G(z(t))$$

where $$z(t) = \begin{pmatrix} \vec{y}(t), \vec{y}(t-\tau), \ldots, \vec{y}(t-(d-1)\tau), \\ \vec{u}(t), \vec{u}(t-\sigma), \ldots, \vec{u}(t-(k-1)\sigma) \end{pmatrix}$$

Moreover, in the method 100' of the present invention, the step of fitting 105' involves finding coefficients of a specific form of the function $G(\bullet)$ known as a radial basis function given by $$y(t+1) = \beta + \alpha \cdot z(t) + \sum_{i=1}^{M} \omega_i \phi(\|c_i - z(t)\|) \qquad (2)$$

wherein the coefficients $\beta$, $\alpha$, $\omega_i$ are constant parameters to be estimated or determined during the step of fitting 105'.

The coefficients $c_i$ are known as centers and are also determined during the step of fitting 105'. The centers are essentially localization functions. The centers can be chosen arbitrarily or using iterative techniques such as least-squares. The preferred methods for selecting the centers $c_i$ are the "subset selection methods" of K. Judd and A. Mees, "On selecting models for nonlinear time series," *Physica* 82D, 1995, pp. 426–444 incorporated herein by reference. These subset selection methods find a subset of centers from a candidate set chosen arbitrarily that best describes the data.

The function $\phi(\bullet)$ within the radial basis function of equation (2) is a novel modified gaussian function and is given by $$\phi(\|c - z\|) = e^{-\frac{1}{2v^2}\|c-x\|^2} \left[ e^{-\frac{1}{2\omega^2}\|d\|^2} - e^{-\frac{1}{2\omega^2}\|d-u\|^2} \right] \qquad (3)$$

wherein x represents the part of z reconstructed using prior output values, and u represents the parts of z constructed from the input signal 204'. The coefficients c is the "output" center associated with and having the same dimension as x and similarly the coefficient d is the "input" center associated with and having the same dimension as u. The terms v and w are the fixed-widths of "output" and "input" gaussian functions of equation (3). In the preferred embodiment of the method 100' of the present invention, the terms v and w are calculated from the standard deviations of the output and input data respectively.

Advantageously, the use of the novel basis function given in equation (2) with equation (3) produce behavioral models whose predicted output converges to a constant output value for conditions when the input signal 204' is zero (u=0). This result is achieved by the novel partitioning of equation (3) produces behavioral models that are stable in the presence of a zero stimulus condition.

Furthermore, in the method 100', the input signal 204' of the step of applying 101' can be any time-domain signal that provides adequate phase space coverage including the input signal 204, described above, and the input signals of the co-pending application.

In yet another embodiment, the method 100" of producing a behavioral model of the present invention comprises the step of applying 101 an input signal 204, the step of sampling 102 the input signal 204, the step of measuring 103 the output signal 206, the step of creating 104 an embedded data set 213, the step of fitting 105' a function to the embedded data 213, and the step of verifying 106 the fitted function. Method 100" differs from method 100 and method 100' in that the step of applying 101 utilizes the CDMA type signal 204 of equation (1) of method 100 and the step of fitting 105' utilizes the novel radial basis function given by equation (2) in conjunction with equation (3) of method 100'.

Figure 3:
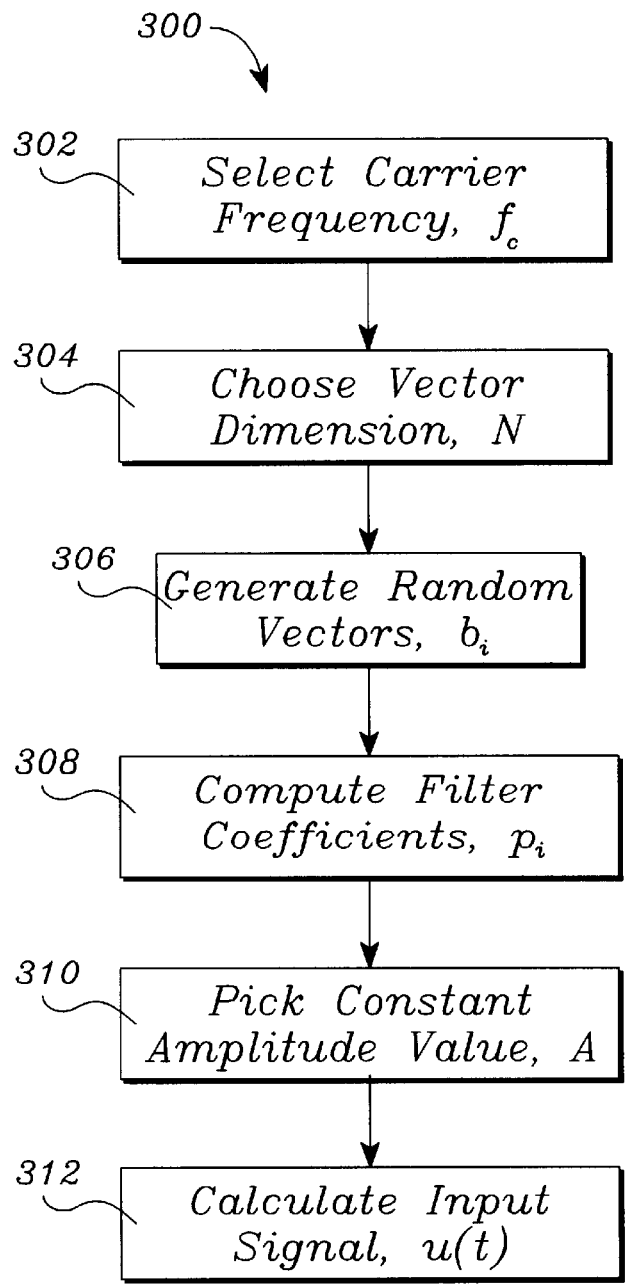
FIG. 3 illustrates a block diagram of the method of constructing an excitation signal in accordance with the invention.

In another aspect of the invention, a method 300 of constructing a CDMA type input or excitation signal 204 for use in the step of applying 101 of the methods 100, 100" of the present invention is provided. The method 300 of constructing is illustrated in FIG. 3. The method of constructing 300 a CDMA type input signal 204 given by equation (1) comprises the step of selecting 302 a carrier frequency $f_c$. The carrier frequency $f_c$ is preferably selected 302 based on an expected or desired operational range in which the nonlinear device is to be operated. For example, if an amplifier intended for cellular base station applications is being modeled, then the carrier frequency $f_c$ can be selected 302 to correspond to the center of the cellular telephone frequency bands. One skilled in the art would be readily able to select 302 a suitable carrier frequency $f_c$ for a given example without undue experimentation.

The method of constructing 300 further comprises the step of choosing 304 a vector dimension N. The vector dimension N is an arbitrary integer but is generally chosen 304 to be an integer greater than forty. Preferably, N is an integer in the range between forty-five and sixty.

The method of constructing 300 still further comprises the step of generating 306 the random vectors $b_i$. Preferably the random vectors $b_i$ are uniformly distributed binary psuedo-random noise (PN) sequences comprised of sequences of 1's and 0's. A uniformly distributed PN sequence and methods for generating 306 a uniformly distributed PN sequence are well known to those skilled in the art.

The method of constructing 300 still further comprises the step of computing 308 the bandpass filter coefficients $p_i$. As noted above, the bandpass filter coefficients are preferably those of a finite impulse response filter (FIR) that provides an input signal 204 with a flat spectrum and with a fixed bandwidth about a given center frequency. The step of computing 308 a suitable set of filter coefficients $p_i$ can be accomplished with techniques that are well known in the art. For example, a suitable FIR bandpass filter design is the one used for the industry standard IS-95 CDMA pulse shaping application and is described in detail in J. S. Lee and L. E. Miller, *CDMA Systems Engineering Handbook*, Artech House, Boston, 1998, pp. 58–64.

The method of constructing 300 still further comprises the step of picking 310 a constant amplitude value A and the step of calculating 312 the input signal 204 using equation (1). The step of picking 310 the constant amplitude value A depends on the characteristics of the nonlinear device being modeled. Generally A is picked 310 to adjust the peak and average values of the input signal to be within a range of acceptable operation for the nonlinear device being modeled. One skilled in the art would readily be able to pick 310 a suitable value for A for a given nonlinear device. The step of calculating 312 the input signal 204, u(t) of equation (1), or the input signal 204 comprises the steps of inserting the values of the coefficients and PN sequences determined in step 302–310 into equation (1) and indexing the equation (1) on the variable t.

Figure 4:
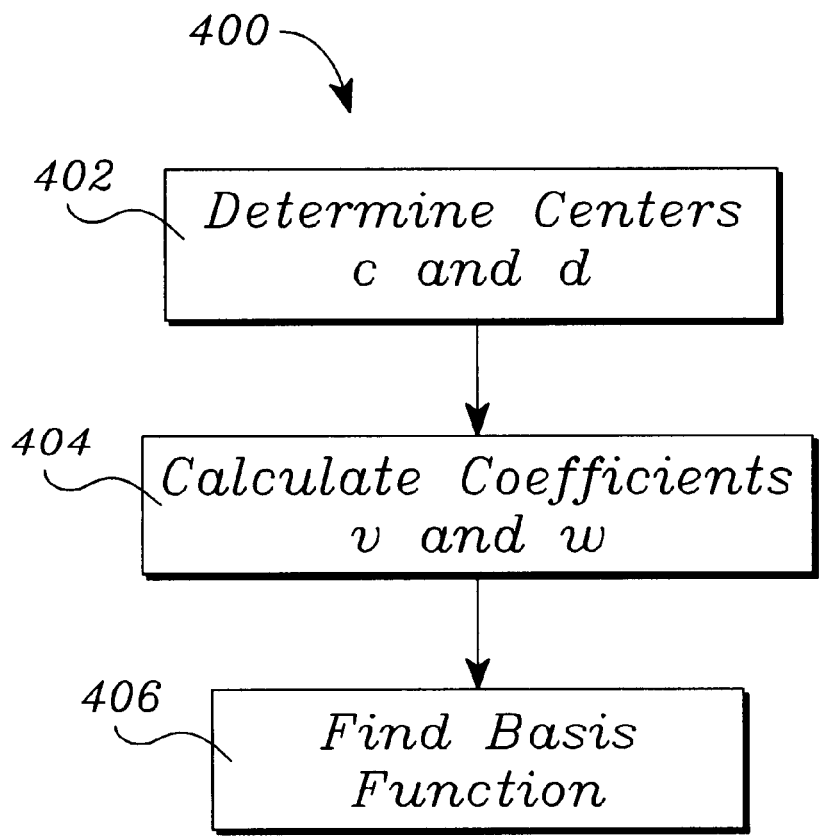
FIG. 4 illustrates a block diagram of the method of determining a radial basis functions in accordance with the invention.

In yet another aspect of the invention, a method 400 of determining a radial basis function given by equations (2) and (3) for use in the step of fitting 105' of the methods 100', 100" of the present invention is provided. A block diagram of the method 400 of the present invention is illustrated in FIG. 4. The radial basis function is defined by equation (2). In the preferred embodiment of method 400, the radial basis function of equation (2) utilizes the modified gaussian function given by equation (3).

Accordingly, the method 400 comprises the step of determining 402 the output center c and the input center d. The centers c and d can be determined arbitrarily or through any of several techniques including least-squares, a method known in the art. The preferred techniques of determining 402 the set of output centers c and the input centers d is that described by Judd and Mees, referenced above.

The method 400 further comprises the step of calculating 404 the output widths v and the input widths w. In the preferred embodiment of the method 400, the coefficient v is equal to the standard deviation of the first subset of the input data 210a and the coefficient w is equal to the standard deviation of the first subset of the output data 212a.

The method 400 still further comprises the step of finding 406 the basis function. The centers and the coefficients determined in steps 402 and 404 are inserted into the modified gaussian function of equation (3). The modified gaussian function of equation (3) is then used in equation (2) during the step of fitting 105' wherein the parameters β, α, and ω, are iteratively determined.

Thus there has been disclosed new and non-obvious methods for the extraction of a behavioral model of a nonlinear device from embeddings of time-series of sampled and measured input and output signals utilizing CDMA type input signals and/or a novel radial basis function. Moreover, a method of determining a novel radial basis function and a method of constructing a CDMA type input signal have been disclosed. Changes and modifications may be made to the invention that may be readily apparent to those skilled in the art without going beyond the intended scope of the invention, as defined by the appended claims.

What is claimed is:

1. A method of producing a behavioral model of a nonlinear device from embeddings of time-domain measurements, the device being real or virtual and having one or more input ports and one or more output ports, the method comprising:

applying an input signal to the input port of the nonlinear device;

sampling the input signal to produce input data;

measuring a response to the input signal at the output port of the device to produce output data corresponding to the input data;

creating an embedded data set using a first subset of the input data and a first subset of the output data;

fitting a function to the embedded data set; and verifying the fitted function using a second subset of the input data and a second subset of the output data, such that the verified fitted function is the behavioral model of the nonlinear device, wherein applying an input signal comprises constructing a CDMA type signal u(t) as the input signal, the CDMA type signal being given by $$u(t) = A \cos(2\pi f_c t) \sum_{i=1}^{N} b_i(t) p_i$$

where $f_c$ is a center frequency, $b_i(t)$ are random vectors, $p_i$ are coefficients of a bandpass finite impulse response (FIR) filter, N is a vector dimension expressed as an integer, and A is a constant amplitude value, the constructed CDMA type input signal being applied to the input port of the nonlinear device.

2. The method of claim 1, wherein constructing a CDMA type signal u(t) comprises:

selecting the center frequency $f_c$, the center frequency $f_c$ being a center frequency of an operational range of the nonlinear device;

choosing the vector dimension N;

generating the random vectors $b_i$, the random vectors $b_i(t)$ being uniformly distributed binary random vectors of 1's and 0's;

computing the filter coefficients $p_i$;

picking the constant amplitude value A; and calculating the input signal u(t).

3. The method of claim 1 wherein the step of fitting a function comprises using a radial basis function given by $$y(t+1) = \beta + \alpha \cdot z(t) + \sum_{i=t}^{M} \omega_i \phi(\|c_i - z(t)\|)$$

wherein β, α, and $\omega_i$ are coefficients that are determined during the step of fitting, z(t) is output data, and $c_i$ are centers of the radial basis function and wherein φ(•) is a function of the centers $c_i$ and the output data z(t).

4. The method of claim 3 wherein the function φ(•) is a modified gaussian function given by $$\phi(\|c-z\|) = e^{-\frac{1}{2v^2}\|c-x\|^2} \left[ e^{-\frac{1}{2\omega^2}\|d\|^2} - e^{-\frac{1}{2\omega^2}\|d-u\|^2} \right]$$

wherein x represents a part of z reconstructed using prior output values, u represent the parts of z constructed from the input signal, the coefficient c is an output center associated with and having a same dimension as x, the coefficient d is an input center associated with and having a same dimension as u, and the terms v and w are fixed-widths of output and input gaussian functions, respectively.

5. A method of producing a behavioral model of a nonlinear device from embeddings of time-domain measurements, the device being real or virtual having one or more input ports and one or more output ports, the method comprising:

applying an input signal to the input port of the nonlinear device;

sampling the input signal to produce input data;

measuring a response to the input signal at the output port of the device to produce output data corresponding to the input data;

creating an embedded data set using a first subset of the input data and a first subset of the output data;

fitting a function to the embedded data set; and verifying the fitted function using a second subset of the input data and a second subset of the output data, such that the verified fitted function is the behavioral model of the nonlinear device, wherein fitting a function comprises using a radial basis function to fit to the embedded data set, the radial basis function being given by $$y(t+1) = \beta + \alpha \cdot z(t) + \sum_{i=t}^{M} \omega_i \phi(\|c_i - z(t)\|)$$

where β, α, and $\omega_i$ are coefficients that are determined during fitting a function, term z(t) comprises input and output data, $c_i$ are centers of the radial basis function, and φ(•) is a function of the centers $c_i$ and the term z(t).

6. The method of claim 5 wherein the function φ(•) is a modified gaussian function given by $$\phi(\|c-z\|) = e^{-\frac{1}{2v^2}\|c-x\|^2} \left[ e^{-\frac{1}{2\omega^2}\|d\|^2} - e^{-\frac{1}{2\omega^2}\|d-u\|^2} \right]$$

wherein x represents a part of z reconstructed using prior output values, u represent the parts of z constructed from the input signal, the coefficient c is an output center associated with and having a same dimension as x, the coefficient d is an input center associated with and having a same dimension as u, and the terms v and w are fixed-widths of output and input gaussian functions, respectively.

7. A method of producing a behavioral model of a nonlinear device from embeddings of time-domain measurements, the device being real or virtual having one or more input ports and one or more output ports, the method comprising:

applying an input signal to the input port of the nonlinear device;

sampling the input signal to produce input data;

measuring a response to the input signal at the output port of the device to produce output data corresponding to the input data;

creating an embedded data set using a first subset of the input data and a first subset of the output data;

fitting a function to the embedded data set; and verifying the fitted function using a second subset of the input data and a second subset of the output data, such that the verified fitted function is the behavioral model of the nonlinear device, wherein fitting a function comprises using a radial basis function to fit to the embedded data set, the radial basis function being given by $$y(t+1) = \beta + \alpha \cdot z(t) + \sum_{i=1}^{M} \omega_i \phi(\|c_i - z(t)\|)$$

where β, α, and $\omega_i$ are coefficients that are determined during fitting a function, term z(t) comprises input and output data, $c_i$ are centers of the radial basis function, and φ(•) is a function of the centers $c_i$ and the term z(t), and wherein applying an input signal comprises constructing a CDMA type signal u(t) as the input signal, the CDMA type signal being given by $$u(t) = A\cos(2\pi f_c t) \sum_{i=1}^{N} b_i(t) p_i$$

where $f_c$ is a center frequency, $b_i(t)$ are random vectors, $p_i$ are coefficients of a bandpass finite impulse response (FIR) filter, N is a vector dimension expressed as an integer, and A is a constant amplitude value, the constructed CDMA type input signal being applied to the input port of the nonlinear device.

8. A method of determining a radial basis function for fitting to data that corresponds to a nonlinear device in response to an input signal applied to an input port of the nonlinear device during modeling of the nonlinear device, the method comprising:

determining centers c and d;

calculating coefficients v and w; and finding the radial basis function $$y(t+1) = \beta + \alpha \cdot z(t) + \sum_{i=t}^{M} \omega_i \phi(\|c_i - z(t)\|)$$

where β, α, and $\omega_i$ are coefficients that are determined as the radial basis function is fitted to data obtained from sampling the input signal applied to the nonlinear device and from measuring a response to the input signal from the nonlinear device, term z(t) comprises input and output data, the output data corresponding to the measured response from the nonlinear device, and $c_i$ are centers of the radial basis function, wherein $\phi(\bullet)$ is a modified gaussian function given by $$\phi(\|c-z\|) = e^{-\frac{1}{2v^2}\|c-x\|^2}\left[e^{-\frac{1}{2\omega^2}\|d\|^2} - e^{-\frac{1}{2\omega^2}\|d-u\|^2}\right]$$

where x represents a part of z reconstructed using prior output values, u represent the parts of z constructed from the input signal, the coefficient c is an output center associated with and having a same dimension as x, the coefficient d is an input center associated with and having a same dimension as u, and the terms v and w are fixed-widths of output and input gaussian functions, respectively.

9. The method of claim 8, wherein the term v is a standard deviation of a first subset of the output data and obtained from the nonlinear device wherein the term w is a standard deviation of a first subset of the input data obtained from the sampled input signal applied to the nonlinear device.

10. An apparatus for producing a behavioral model of a nonlinear device from embeddings of time domain measurements, the device having one or more inputs and one or more outputs comprising:

a signal generator for generating an input signal that is applied to the input of the device, the generated input signal being a CDMA type signal being given by $$u(t) = A\cos(2\pi f_c t)\sum_{i=1}^{N} b_i(t)p_i$$

where $f_c$ is a center frequency, $b_i(t)$ are random vectors, $p_i$ are coefficients of a bandpass finite impulse response (FIR) filter, N is a vector dimension expressed as an integer, and A is a constant amplitude value;

a data acquisition system for sampling the input signal, measuring an output signal at the output of the device in response to the input signal and producing input data and output data from the sampled input signal and from the measured output signal; and a signal processing computer for creating an embedded data set from a first subset of the input data and a first subset of the output data, for fitting a function to the embedded data set and for verifying that the fitted function models the device using a second subset of the input data and a second subset of the output data.

11. The apparatus of claim 10, wherein the random vectors $b_i(t)$ are uniformly distributed binary random vectors of 1's and 0's.

12. The apparatus of claim 10, wherein the center frequency $f_c$ is a center frequency of an operational range of the nonlinear device.

13. The apparatus of claim 10, wherein the function used by the signal processing computer to fit to the embedded data comprises a radial basis function given by $$y(t+1) = \beta + \alpha \cdot z(t) + \sum_{i=t}^{M} \omega_i \phi(\|c_i - z(t)\|)$$

where $\beta$, $\alpha$, and $\omega_i$ are coefficients that are determined during fitting a function, term z(t) comprises input and output data, $c_i$ are centers of the radial basis function, and $\phi(\bullet)$ is a function of the centers $c_i$ and the term z(t).

14. The apparatus of claim 13, wherein the function $\phi(\bullet)$ is a modified gaussian function given by $$\phi(\|c-z\|) = e^{-\frac{1}{2v^2}\|c-x\|^2}\left[e^{-\frac{1}{2\omega^2}\|d\|^2} - e^{-\frac{1}{2\omega^2}\|d-u\|^2}\right]$$

wherein x represents a part of z reconstructed using prior output values, u represent the parts of z constructed from the input signal, the coefficient c is an output center associated with and having a same dimension as x, the coefficient d is an input center associated with and having a same dimension as u, and the terms v and w are fixed-widths of output and input gaussian functions, respectively.

15. The apparatus of claim 14, wherein the term v is a standard deviation of the first subset of the output data and wherein the term w is a standard deviation of the first subset of the input data.

16. An apparatus for producing a behavioral model of a nonlinear device from embeddings of time domain measurements, the device having one or more inputs and one or more outputs comprising:

a signal generator for generating an input signal that is applied to the input of the device;

a data acquisition system for sampling the input signal, measuring an output signal at the output of the device in response to the input signal and producing input data and output data from the sampled input signal and from the measured output signal; and a signal processing computer for creating an embedded data set from a first subset of the input data and a first subset of the output data, for fitting a function to the embedded data set and for verifying that the fitted function models the device using a second subset of the input data and a second subset of the output data, wherein the function used by the signal processing computer to fit to the embedded data comprises a radial basis function given by $$y(t+1) = \beta + \alpha \cdot z(t) + \sum_{i=t}^{M} \omega_i \phi(\|c_i - z(t)\|)$$

where $\beta$, $\alpha$, and $\omega_i$ are coefficients that are determined during fitting a function, term z(t) comprises input and output data, $c_i$ are centers of the radial basis function, and $\phi(\bullet)$ is a function of the centers $c_i$ and the term z(t).

17. The apparatus of claim 16, wherein the function $\phi(\bullet)$ is a modified gaussian function given by $$\phi(\|c-z\|) = e^{-\frac{1}{2v^2}\|c-x\|^2}\left[e^{-\frac{1}{2\omega^2}\|d\|^2} - e^{-\frac{1}{2\omega^2}\|d-u\|^2}\right]$$

where x represents a part of z reconstructed using prior output values, u represent the parts of z constructed from the input signal, the coefficient c is an output center associated with and having a same dimension as x, the coefficient d is an input center associated with and having a same dimension as u, and the terms v and w are fixed-widths of output and input gaussian functions, respectively.

18. The apparatus of claim 17, wherein the term v is a standard deviation of the first subset of the output data and wherein the term w is a standard deviation of the first subset of the input data.

19. An apparatus for producing a behavioral model of a nonlinear device from embeddings of time domain measurements, the device having one or more inputs and one or more outputs comprising:

a signal generator for generating an input signal that is applied to the input of the device;

a data acquisition system for sampling the input signal, measuring an output signal at the output of the device in response to the input signal and producing input data and output data from the sampled input signal and from the measured output signal; and a signal processing computer for creating an embedded data set from a first subset of the input data and a first subset of the output data, for fitting a function to the embedded data set and for verifying that the fitted function models the device using a second subset of the input data and a second subset of the output data, wherein the function used by the signal processing computer to fit to the embedded data comprises a radial basis function given by $$y(t+1) = \beta + \alpha \cdot z(t) + \sum_{i=1}^{M} \omega_i \phi(\|c_i - z(t)\|)$$

where $\beta$, $\alpha$, and $\omega_i$ are coefficients that are determined during fitting a function, term z(t) comprises input and output data, $c_i$ are centers of the radial basis function, and $\phi(\bullet)$ is a function of the centers $c_i$ and the term z(t), and wherein the signal generator generates a CDMA type signal as the input signal, the CDMA type input signal being given by $$u(t) = A \cos(2\pi f_c t) \sum_{i=1}^{N} b_i(t) p_i$$

where $f_c$ is a center frequency, $b_i(t)$ are random vectors, $p_i$ are coefficients of a bandpass finite impulse response (FIR) filter, N is a vector dimension expressed as an integer, and A is a constant amplitude value.

20. The apparatus of claim 19, wherein the random vectors $b_i(t)$ are uniformly distributed binary random vectors of 1's and 0's, and wherein the center frequency $f_c$ is a center frequency of an operational range of the nonlinear device.

\* \* \* \* \*